United States Patent [19]

Liu et al.

[11] 4,401,505

[45] Aug. 30, 1983

[54] METHOD OF INCREASING MINORITY CARRIER LIFETIME IN SILICON WEB OR THE LIKE

[75] Inventors: James K. Liu, Glendale, Calif.; Guenter H. Schwuttke, Poughkeepsie, N.Y.; Krishna M. Koliwad, La Canada, Calif.

[73] Assignee: The United States of America as represented by the Administrator National Aeronautics and Space Administration, Washington, D.C.

[21] Appl. No.: 364,092

[22] Filed: Mar. 31, 1982

[51] Int. Cl.³ .................... C30B 15/34; C30B 29/06; C30B 33/00
[52] U.S. Cl. .................... 156/608; 156/DIG. 66; 156/DIG. 73
[58] Field of Search ............ 156/605, 608, DIG. 64, 156/DIG. 66, DIG. 73, DIG. 88, DIG. 89

[56] References Cited

U.S. PATENT DOCUMENTS

| | | | |
|---|---|---|---|
| 3,856,472 | 12/1974 | Schweitzer et al. | 156/DIG. 66 |
| 4,018,626 | 4/1977 | Schwuttke et al. | 148/1.5 |
| 4,165,249 | 8/1979 | Heywang | 156/DIG. 66 |
| 4,220,483 | 9/1980 | Cazcarra | 156/DIG. 66 |
| 4,257,827 | 3/1981 | Schwuttke et al. | 148/1.5 |
| 4,276,114 | 6/1981 | Takano et al. | 156/DIG. 66 |

FOREIGN PATENT DOCUMENTS 1816083 6/1970 Fed. Rep. of Germany ... 156/DIG. 66

OTHER PUBLICATIONS

Biedermann; "Producing Silicon Semiconductor Wafers ..."; IBM Tech. Bull.; vol. 19; No. 4; p. 1295; Sep. 1976.
"Lifetime Control in Silicon through Impact Sound Stressing" by Schwuttke et al.; Phys. Stat. Sol.; 42; p. 553; Apr. 1977.
"Minority Carrier Lifetime Improvement in Silicon through Laser Damage Gettering" by Yang et al.; Phys. Stat. Sol.; 58; p. 127; Oct. 1979.
"Dislocation Reactions in Silicon Web-Dendrite Crystals" by S. O'Hara et al.; J. Appl. Phys.; vol. 36; No. 8; p. 2475; Aug. 1965.

Primary Examiner—Bradley Garris
Attorney, Agent, or Firm—John R. Manning; Paul F. McCaul; Thomas H. Jones

[57] ABSTRACT

A silicon dendrite is grown as a ribbon forming two silicon crystal layers which are separated by an interface layer which contains a large number of defects. Significant increase of minority carrier lifetime with homogeneous distribution at the outer surfaces of the two silicon crystal layers are achieved by processing the web in an atmosphere of a selected gas, e.g. oxygen, nitrogen or an inert gas, for about 30 minutes to several hours at a temperature preferably on the order of 900° C.–1200° C.

10 Claims, 2 Drawing Figures

METHOD OF INCREASING MINORITY CARRIER LIFETIME IN SILICON WEB OR THE LIKE

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

1. Field of the Invention

The present invention is directed to a method of improving semiconductor matter and, more particularly, to a method of engineering minority carrier lifetime in silicon material as needed for in the fabrication of high density Very Large Scale Integration (VLSI) semiconductor devices and high performance solar cells.

2. Description of the Prior Art

Increasing the lifetime of minority carriers in Silicon material used for fabricating semiconductor VLSI devices such as high density memories or high performance solar cells is of paramount importance. As is also appreciated, increased minority carrier lifetime, hereafter also referred to as increased lifetime, is achievable by gathering impurities in the semiconductor material to defective points in such material. This process is called 'gettering'. To improve the material, it is necessary to getter the impurities away from the surface of the material where the active circuits are fabricated. As used in the art and herein, impurities refer to foreign atoms or bodies in a layer of material, while defects relate to distortion of the crystaline lattice symmetry of the material.

Heretofore, it has been suggested that increased lifetime in a surface layer can be achieved by purposely damaging the bottom side of a semiconductor material, such as silicon, and subsequently annealing the silicon material. Although it is claimed that increased lifetime is achieved, the need to purposely damage the crystal is highly undesirable and the resulting increased lifetime is limited for the following reasons.

The extent and distribution of damage, introduced in one wafer, cannot be duplicated in other wafers. Thus, the increased lifetime is not reproducible. Also, due to the thickness of the wafer, or crystal, relatively extensive damage must be induced. Quite often, the damage, which is intentionally produced at the wafer's bottom side, extends to the top surface or close to it, thereby destroying the usefulness of the gettering process. Furthermore, the damage in the crystal is typically not uniform and therefore, the increased lifetime at the surface is highly irregular on a microscopic scale which is most undesirable.

OBJECTS AND SUMMARY OF THE INVENTION

It is a primary object of the present invention to provide a new improved method of producing homogenous minority carrier lifetime distributions in a silicon wafer.

The above and other objects of the invention are achieved in connection with a silicon dendrite web. The process of forming a silicon dendrite web, also referred to as a ribbon is well known. Ignoring the raised edges, which characterize a silicon dendrite web, it can be viewed as consisting of the two single crystal silicon layers, separated by an interface layer, hereafter referred to as the twin plane. The twin plane contains a large number of defects as the result of the web's growth process. It has been discovered that by annealing a silicon dendrite web at a selected temperature range for a selected period in a selected environment, very significant increases in lifetime at or near the outer surfaces of the web are realized.

The novel features of the invention are set forth with particularity in the appended claims. The invention will be best understood from the following description when read in conjunction with the accompanying drawings.

DETAILED DESCRIPTION OF THE DRAWINGS

Figure 1:
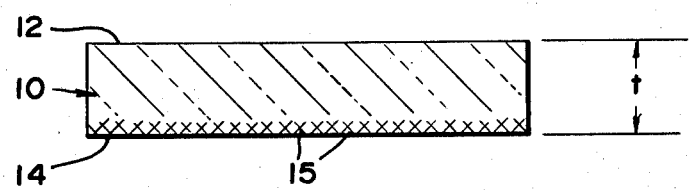
FIG. 1 is a cross sectional view of a silicon crystal useful in explaining the prior art methods.

In order to highlight the advantages of the present invention attention is first directed to FIG. 1 wherein a single crystal 10, such as silicon, is shown in cross-sectional view. The crystal 10 of a thickness which is generally on the order of 6-10 mils has a top side or surface 12, upon which devices are fabricated and a bottom side 14. It is at or near surface 12 whereat increased lifetime of minority carriers is desired by removing impurities therefrom. In the prior art, physical damage is induced at the bottom surface 14 as indicated by small x's designated by numeral 15.

The many disadvantages of the proposed prior art methods have been discussed hereabove. These include: (a) physical damage to the crystal which often extends to the surface 12, thus destroying the usefulness of the crystal; (b) irreproducible results between batches of damaged crystals as well as between crystals in the same batch; (c) highly nonuniform increased lifetime at or near the top surface; and (d) most of the impurity gettering occurs near the bottom side 14 where the damage is produced.

Since the crystal is relatively thick, e.g. 6-10 mils, in order to effect the minority carrier lifetime at or near the surface 12, relatively extensive damage has to be produced. A danger however is present that the relatively large damage may itself extend to or near surface 12, thereby destroying the usefulness of the crystal for any purpose. The extension of the damage to surface 12 may occur when producing the damage or during subsequent processing.

Figure 2:
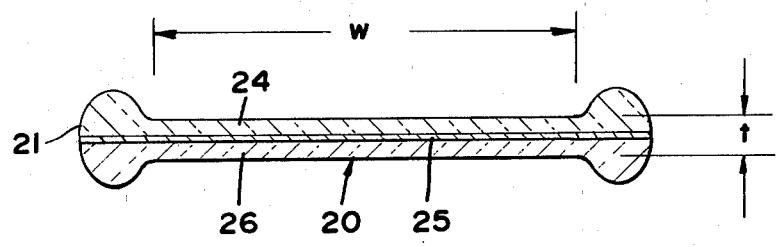
FIG. 2 is a cross sectional view of a silicon dendrite web, useful in explaining the present invention.

Unlike the prior art, the method of the present invention is directed to increasing the lifetime of minority carriers in a dendrite web or ribbon, shown in cross sectional view in FIG. 2 and designated by numeral 20. Basically, such a silicon ribbon consists of two opposite layers of silicon 24 and 26 with an interface layer 25. It is layer 25 also referred to as the defect plane, or twin plane which effectively separates the ribbon into the two layers 24 and 26. The width of the web or ribbon 20 which is of uniform thickness t is designated by w. Layer 25 contains defects as a result of the web growth process. It is generally in the middle of the ribbon's thickness. Thus, the thickness of each of layers 24 and 26 is on the order of $\frac{1}{2}t$ or less, which is about 3-5 mils or less. It has been discovered that since the web 20, as a result of its growth in a furnace, contains the defect-containing layer 25 in non-equilibrium, such a web can be processed very effectively to produce dramatically enhanced lifetime of minority carriers distributed homogeneously at or near the outer surface of both the layers 24 and 26.

In accordance with the present invention, after the ribbon is grown, it is subjected to a preannealing step at a selected temperature range for a selected duration in a selected environment. The temperature range is preferably on the order of 900°–1200° C. and the duration is on the order of 30 minutes to 3 hours. As to the environment, very satisfactory annealing results have been achieved with either oxygen, nitrogen or other inert gases. Similar satisfactory results have been obtained in oxygen, containing various amounts of HCl.

There are major significant advantages from the practice of the present invention, as compared to the prior art. Herein, since the defect-containing layer 25 is inherently present in the ribbon, there is no need to purposely produce physical damage. Also, since the layer 24 extends uniformly across the web and along its length the defects are uniformly distributed, and therefore, more uniform gettering of impurities is achieved, resulting in more uniform or homogeneous increased lifetime.

This contrasts with the prior art, in which the damage does not produce uniformly distributed defects and therefore any increased lifetime is not uniform. In addition in the dendrite web, the defect-containing layer 25 is very close to the surface of either layer 24 or 26, e.g. about 3–5 mils. Thus, when practicing the present invention impurities are gathered by the defects in layer 25 away from the surfaces of layers 24 and 26.

Tests conducted on web dendrites processed in accordance with the present invention indicate very uniform increased lifetime. Tests at most incremental areas indicated lifetime of over 10 microseconds ($\mu$s), with many areas indicating a lifetime of several hundred $\mu$s, and up to and greater than 400 $\mu$s. On the other hand, tests on web dendrites which were not processed in accordance with the present invention indicated very low lifetimes with only few incremental areas exhibiting a lifetime of more than 10 $\mu$s. Although particular embodiments of the invention have been described and illustrated herein, it is recognized that modifications and variations may readily occur to those skilled in that art and consequently, it is intended that the claims be interpreted to cover such modifications and equivalents.

What is claimed is:

1. A process of increasing the lifetime of minority carriers the steps comprising:
   simultaneously growing a multiple layer semiconductor material to possess at least one layer containing impurities and a layer containing inherent defects resulting from the growing step;
   placing said material in a furnace containing at least one preselected gas; and
   heating said material in said furnace for a selected duration and temperature, whereby impurities in said one layer are gathered by defects in said layer containing defects.

2. A process of increasing the lifetime of minority carriers as recited in claim 1 wherein said gas is selected from the group consisting of oxygen and nitrogen.

3. A process of increasing the lifetime of minority carriers as recited in claim 1 wherein said semiconductor material is silicon.

4. A process of increasing the lifetime of minority carriers as recited in claim 3 wherein said gas is selected from the group consisting of oxygen and nitrogen.

5. A process of increasing the lifetime of minority carriers in a silicon dendrite web, characterized by a pair of layers of silicon containing impurities which layers are spaced apart by an interfacial layer containing inherent defects resulting from growing the web, the steps comprising:
   placing said dendrite web in a furnace containing at least one preselected gas; and
   annealing said dendrite web in said furnace by heating the web to a temperature on the order of not less than 900° C. for a selected duration whereby impurities in at least one of said silicon layers are gathered by defects in said interfacial layer.

6. A process of increasing the lifetime of minority carriers as recited in claim 5 wherein said selected duration is on the order of not less than one half hour.

7. A process of increasing the lifetime of minority carriers as recited in claim 6 wherein the web is heated to a temperature in the range of 900° C.–1200° C.

8. A process of increasing the lifetime of minority carriers as recited in claim 5 wherein the gas is selected from the group consisting of oxygen and nitrogen.

9. A process of increasing the lifetime of minority carriers as recited in claim 8 wherein said selected duration is on the order of between one half to three hours.

10. A process of increasing the lifetime of minority carriers as recited in claim 9 wherein the web is heated to a temperature in the range of 900° C.–1200° C. and the gas is oxygen.

* * * * *